(12) United States Patent
Watanabe et al.

(10) Patent No.: US 6,437,236 B2
(45) Date of Patent: Aug. 20, 2002

(54) SOLAR CELL PANEL

(75) Inventors: Kunihiko Watanabe; Makoto Higashikozono; Hiroyuki Yoshikawa, all of Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 09/767,861

(22) Filed: Jan. 24, 2001

(30) Foreign Application Priority Data

Jan. 24, 2000 (JP) ........................................ 2000-013749

(51) Int. Cl.[7] ........................ H01L 31/048; H01L 31/05
(52) U.S. Cl. ...................... 136/251; 136/244; 136/291; 136/293; 439/271; 439/571
(58) Field of Search ................................. 136/244, 251, 136/291, 293; 439/571, 271

(56) References Cited

U.S. PATENT DOCUMENTS 4,283,106 A * 8/1981 Bunnell ...................... 439/571
4,310,211 A * 1/1982 Bunnell et al. ............. 136/244
6,075,201 A * 6/2000 Wambach ................... 136/251

FOREIGN PATENT DOCUMENTS

| JP | 10-270738 A | * 10/1998 |
| JP | 10-303447 A | * 11/1998 |
| JP | 11-35346 A | * 2/1999 |

* cited by examiner

Primary Examiner—Alan Diamond
(74) Attorney, Agent, or Firm—Oliff & Berridge, PLC

(57) ABSTRACT

A solar cell panel has a pair of superimposed plates, and one or more solar energy cells sandwiched between the plates. A connector for making electrical connection to an external connection member in use of the panel is mounted on the periphery of the superimposed plates. To achieve a compact and simple construction, one-piece strip metal electrical conductor members have first ends located between the superimposed plates and electrically connected to the solar energy cells and second ends which protrude from the periphery and are held in a housing of the connector. The second ends act as electrical terminals.

8 Claims, 5 Drawing Sheets

US 6,437,236 B2

SOLAR CELL PANEL

BACKGROUND OF THE INVENTION

1. Field of Invention

The present invention relates to a solar cell panel for electricity generation using solar energy, having a connector incorporated therein.

2. Description of Related Art

FIG. 5 shows one form of known solar cell panel 100 having a connector 110 for connecting with an external connector 120 provided on the end of cable K. The connector 110 is firmly fixed on the outer periphery of the panel 100 which is made of a pair of glass sheets 101, between which a plurality of solar cell elements 102 in a two-dimensional array are sandwiched. The solar cell elements 102 are electrically connected mutually in series or in parallel between the pair of glass sheets 101 by tape-like conductors 103, which are electrically connected with the connector 110 through a connecting sheet 105.

In the connecting sheet 105 a pair of thin ribbon-like conductors 106, which are arranged in parallel at suitable spacing, is sandwiched by insulation sheets 107. The conductors 103 from the solar cell elements 102 are electrically connected by soldering, etc. to the respective conductors 106.

Tape-like conductors 109 are electrically connected by soldering, etc. to the conductors 106 in the end area of the connecting sheet 105, and extend to the outer peripheral area of the panel 100 to be connected to the connector 110.

When the external connector 120 on the cable K is connected with the connector 110, the solar cell panel 100 is electrically connected to an external load or storage battery.

Generally, the electrical connection in connector 110 and external connector 120 is performed by locking together of positive and negative terminals inside the connectors. Thus a negative and a positive terminal are arranged in the housing of the connector 110, and electrically connected by for example soldering to the conductors 109 which extend from the outer peripheral area of the panel 100. However, space is required for connecting the conductors 109 and the negative terminal and the positive terminal inside the connector 110, which causes a problem that the whole shape of the connector 110 becomes large. This is unfavorable for design reasons, because the connector 110 itself is conspicuous when the solar cell panel is installed on the window frame or on the roof of a building, etc. If a large frame body is installed around the panel 100 to hide the connector 110, the effective area contributing to solar energy electricity generation is decreased.

U.S. Pat. No. 4,283,106 shows a single-pole connector mountable on a solar panel by engagement of a slot on the connector housing with a cut-out in a peripheral projecting flange of the panel. A strip-shape conductor protrudes from between superimposed sheets of the panel and is soldered to an exposed base member of a folded metal terminal construction mounted in the connector housing. The arrangement is space-consuming, since both the flange and the connector project above the plane of the panel. Soldering of the conductor to the terminal construction is inconvenient.

SUMMARY OF THE INVENTION

An object of the present invention is to provide a connector of compact structure on a solar cell panel.

According to the invention, there is provided a solar cell panel having a pair of superimposed plates and at least one solar energy cell sandwiched between the plates. A connector, used in making electrical connection to an external connection member in use of the solar cell, is mounted on the superimposed plates at their periphery. At least one one-piece electrical conductor member has a first end located between the superimposed plates and electrically connected to the solar energy cell and a second end which protrudes from the periphery of the plates and is received and held in a housing of the connector where it constitutes an electrical terminal for making electrical connection with the external connection member in use. It is preferred that the electrical conductor is of ribbon-like or strip shape. Typically there are two such conductor members, providing terminals of opposite polarity in the connector housing.

This construction permits a compact and simple connector to be provided at the periphery of the panel.

Preferably, for a compact arrangement, the one-piece electrical conductor member, or each such electrical member, is bent twice, outside the superimposed plates, first to extend in a first direction which is the thickness direction of the superimposed members and secondly to extend in a second direction substantially parallel to an edge of the panel, so as to constitute a pair of parallel spaced terminals of the connector extending in the second direction.

A bypass diode may easily be incorporated, in the housing of the connector, between the two conductors.

Preferably, for locking of the conductor member, or each conductor member, the housing has a locking structure that engages the electrical conductor member and holds the electrical conductor member in its longitudinal position in the housing.

BRIEF DESCRIPTION OF THE DRAWINGS

An embodiment of the invention will now be described by way of non-limitative example with reference to the accompanying drawings, in which.

DETAILED DESCRIPTION OF PREFERRED EMBODIMENTS

Figure 1:
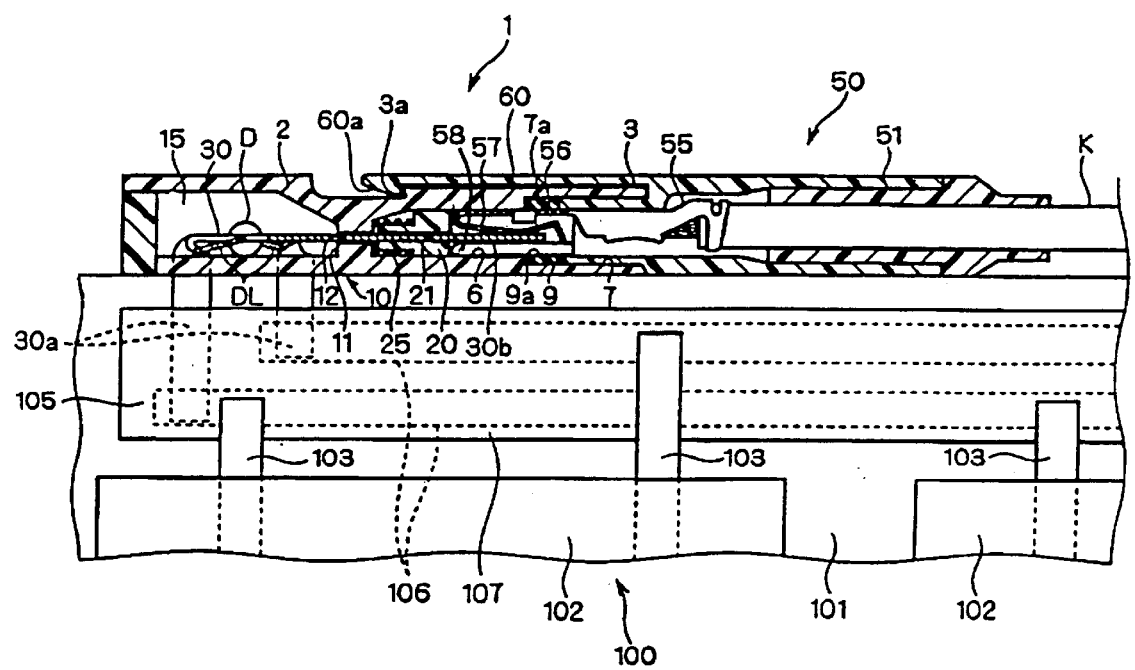
FIG. 1 is a partially sectional side view of a solar cell panel which is an embodiment of the present invention showing the connected condition of an external connector and a connector of the panel.
Figure 2:
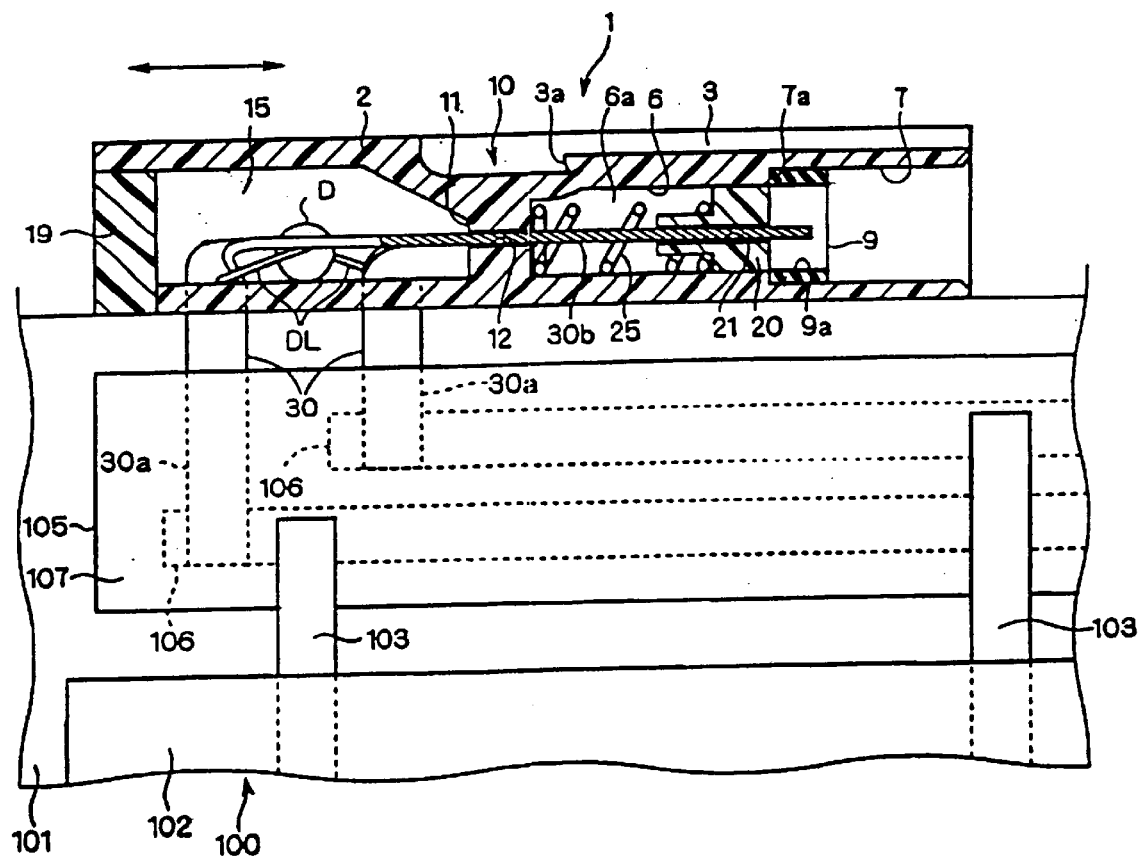
FIG. 2 is a partially sectional side view of the connector shown in FIG. 1 on a larger scale.
Figure 3:
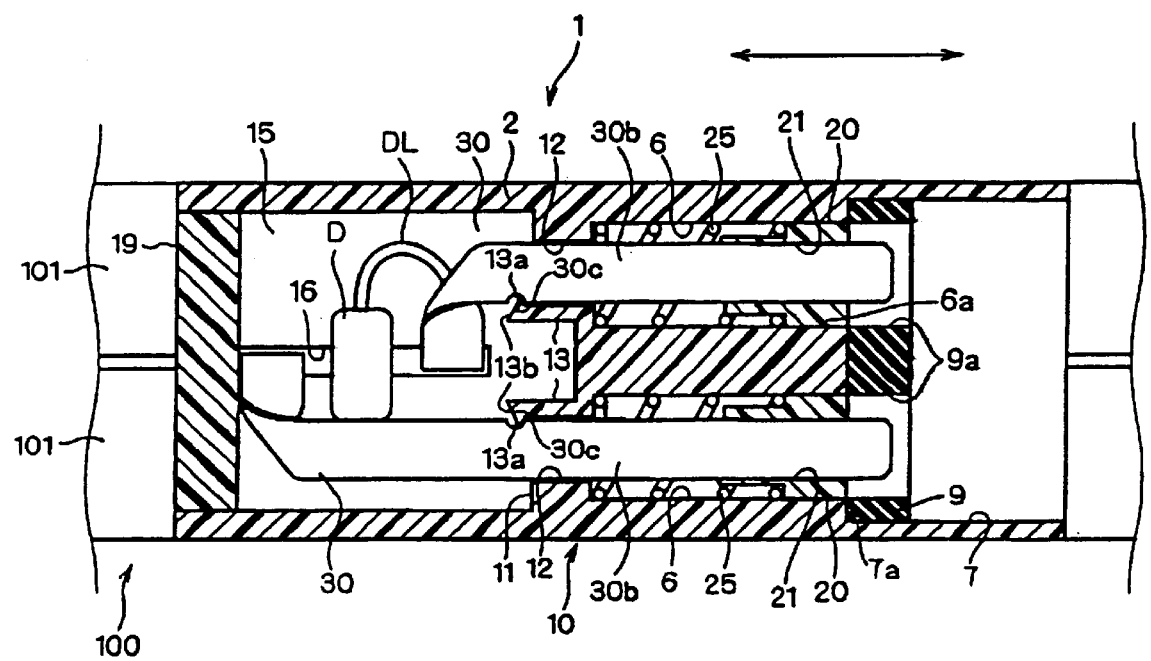
FIG. 3 is a partially sectional plan view of the connector shown in FIG. 1 and FIG. 2.
Figure 4:
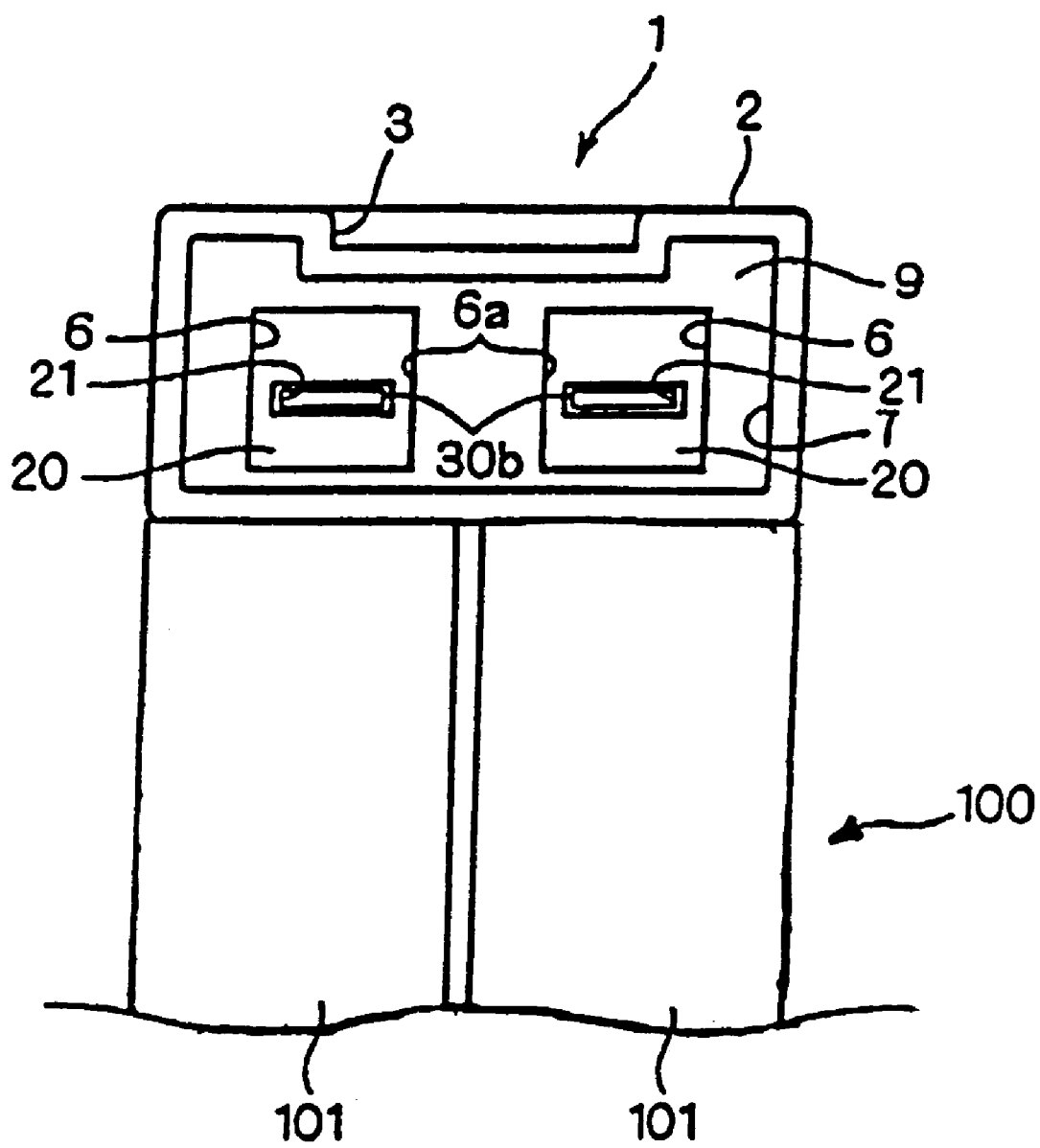
FIG. 4 is an end view of the connector shown in FIG. 1.
Figure 5:
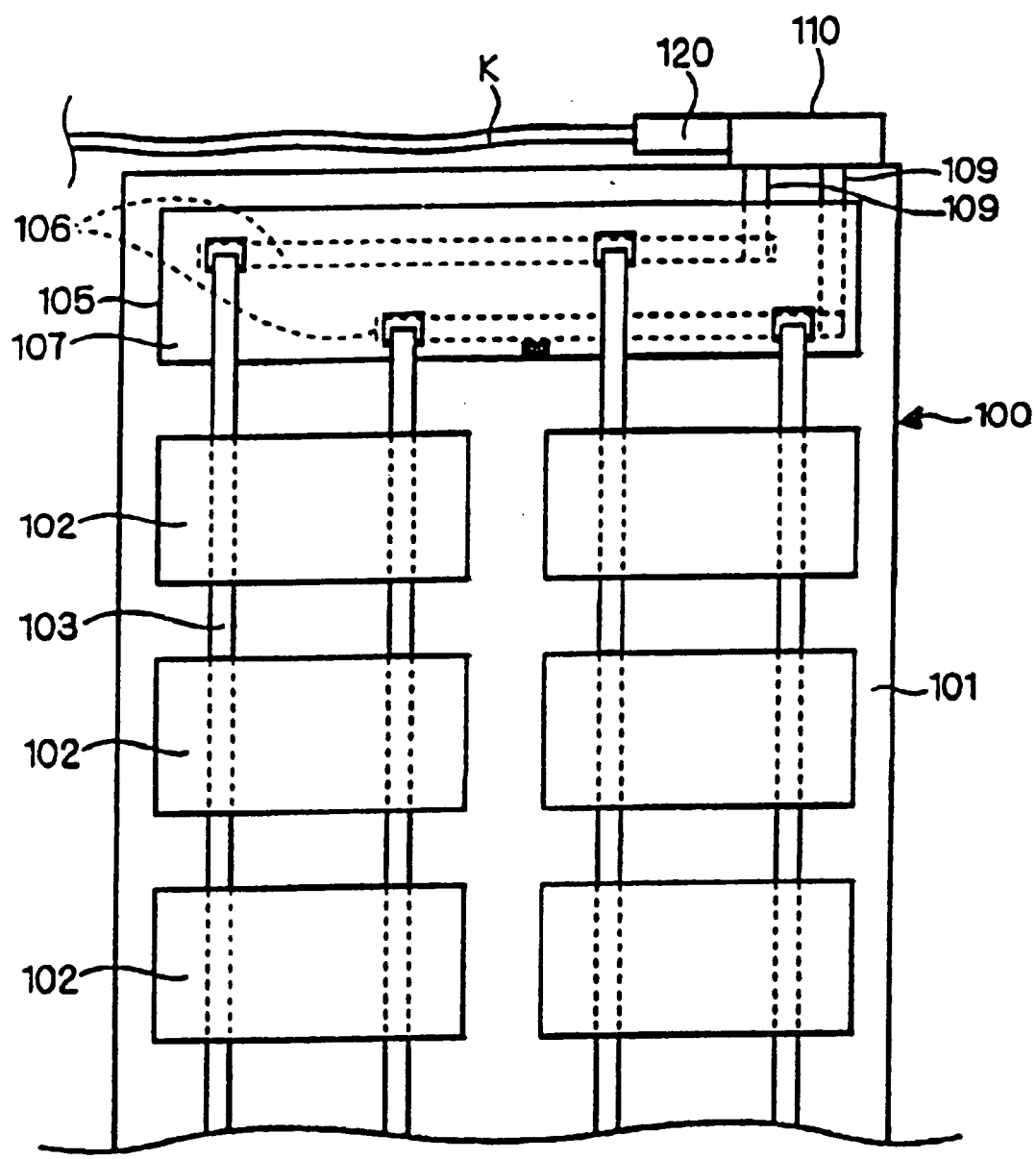
FIG. 5 is a side view showing a connector of a known solar cell panel, described above.

A solar cell panel 100 having a connector 1 which is an embodiment of the present invention is shown in FIGS. 1 to 4, in which the solar cell panel 100 itself is the same as in FIG. 5 except for conductor 109 and connector 110, so that repetition of its description is not needed here. FIGS. 1 to 3 are described as a matter of convenience with reference to a forward direction which is to the right and a backward direction which is to the left (see arrows in FIGS. 2 and 3).

As shown in FIGS. 1 to 4, a connector 1 is installed on the outer periphery of panel 100 to be able to be connected with an external connector 50 which is installed at the end of cable K. The ends of the conductors 30 which extend out from the outer periphery of the panel 100 are held in an insulating housing 2 of the connector 1 and act as terminals 30b that connect with terminals 55 inside the external connector 50. The conductors 30 may be planar, meaning that they have a cross section with a greater width than thickness. For example, a ratio of the thickness of the conductors 30 to the width of the conductors 30 may be in a range of from about 1:2 to about 1:20; or from about 1:4 to about 1:12; or from about 1:6 to about 1:10. An advantage of planar conductors 30 is that, to accommodate increased electrical current, the conductors 30 need only be increased in width, and their thickness does not need to be increased. This avoids increasing the overall thickness of the solar cell panel 100. However, it should be appreciated that in some applications of this invention, the conductors 30 may be round or square, for example, rather than planar.

The external connector 50 may be a two terminal connector installed at the end of a two core cable K, having a housing 51 as shown in FIG. 1 containing two connecting terminals 55 arranged spaced apart and aligned and electrically connected with the respective cores of the external cable K. Each terminal 55 is in use connected with the respective terminal 30b by forcing the planar terminal 30b between a resilient tongue 57 and an abutment seat 58 of a connecting portion 56 of the terminal 55. The whole terminal 55 may be formed of cut and bent metal sheet. The abutment seat 58 may be formed by a side flange part which is folded over so that its edge projects upwardly towards the tongue 57.

The housing 51 has a portion 60 extending towards its tip side having a hook 60a which engages in a latching manner with a recess 3a of the housing 2 of the connector 1.

Each one-piece conductor 30 may be formed by bending a metal strip member made by punching out a thin metal sheet, and has at one end a connecting area 30a sandwiched together with connecting sheet 105 between a pair of glass sheets 101 of the panel 100. The glass sheets 101 are superimposed with adhesive or filler between them which supports the connecting area 30a of each conductor 30 in the required position between them.

The connecting areas 30a of the conductors 30 are arranged between the glass sheets 101 aligned at required intervals along the edge of panel 100 and are electrically connected, e.g. by soldering, to the thin ribbon-like conductors 106 in the connecting sheet 105, which are connected to the leads 103 of the solar cell elements 102 in the connecting sheet 105.

As shown in FIG. 3, the portions of the conductors 30 protruding from the outer periphery of the panel 100 may be bent twice, to extend first in the thickness direction of the panel 100 and secondly in a direction parallel to the edge surface of the panel 100 (i.e., a direction perpendicular to the thickness direction of the panel 100), whereby in housing 2 they extend in a spaced and aligned manner as the respective terminals 30b. The terminals 30b may be coplanar. The housing 2 may have a terminal-supporting region 10 having projections 13a which engage in recesses 30c cut in the terminals 30b, to locate and support the terminals 30b in the backwards/forward direction.

The housing 2 of the connector is flat, and of rectangular cross-section, as seen in FIG. 4, in which a portion of the sheets 101 are shown diagrammatically. At its rear end, the housing 1 has a cavity region 15 (see FIG. 3) bounded by the housing wall containing the bent portions of the conductors 30, and having a slit 16 in its base on the panel 100, at a location corresponding to the gap between the pair of glass sheets 101, so that the conductors 30 can extend from between the sheets directly into the cavity 15. In the cavity 15 may be a diode D, for effecting electrical bypass of the panel 100, which is required under certain operating conditions. The diode D may be connected by leads DL, to the respective conductors 30, e.g. by soldering. A sheet-shape closure 19 closes the end opening of the cavity 15 at the rear side of the connector, in order to prevent access of water.

In the terminal holding region 10, the housing 2 has a barrier wall 11 with through holes 12, through which pass the respective terminals 30b. Thus the terminals 30b are retained in their aligned position substantially parallel to the edge of the panel 100.

Adjacent the through holes 12, as seen in FIG. 3, are the hook-like members 13 of the housing 2, extending in the backward direction and having the projections 13a at their rear ends, to engage with the recesses 30c of the terminals 30b. The members 13 have a flat shape, and are elastically deformable in the transverse direction. The extremity of each member 13 has a surface 13b inclined with respect to the insertion direction of the terminal 30b, so that the terminal 30b pushes the member 13 aside until the projection 13a is engaged with the recess 30c by the spring back of the member 13.

The forward portion of the housing 2 has an open ended cavity 7 that receives the housing 51 of the connector 50. The rearward part of this cavity 7 is divided by a partition 6a to form a pair of terminal insertion passages 6. The terminals 30b extend along these terminal insertion passages 6, and receive and engage the terminals 55 of the external connector 50.

A thick sheet gasket 9, made of resilient material such as rubber, with through holes 9a corresponding to the terminal insertion passages 6, may be arranged against a shoulder 7a of the cavity 7. This gasket 9 is engaged by the housing 51 of the external connector 50, in the connected position of the connectors 1 and 50, to prevent access of water to the connected terminals.

Support members 20 for the terminals 30b may be provided, which are fully slidable along the respective terminal receiving passages 6, and have through-holes 21 through which the terminals 30b pass. The supports 20 serve to maintain the alignment position of the terminals 30b. A resilient member, such as a coil spring 25, may be provided between the base of each terminal receiving passage 6 and the support 20, to urge the support 20 in the forward direction. A stop (not shown) may retain the support 20 in the passage 6.

When the external connector 50 is connected to the connector 2 the tip end of the connecting portion 56 of each terminal 55 of the connector 50 engages the respective terminal support 20 and pushes it in the backward direction. Since at the moment of engagement the terminal 30b is held by the support 20 in the correct position to be inserted between the tongue 57 and the abutment seat 58 of the terminal 55, the risk of deformation of the terminal 30b by the terminal 55 is avoided.

At its upper face, the housing 2 has a groove 3 which receives the extending portion 60 of the housing 51 of the external connector 50, so that the hook end 60a engages with the correspondingly shaped recess 3a to lock the connectors together.

To assemble the solar panel and connector construction shown in FIGS. 1 to 4, first the end portion 30a of the conductors 30 are connected by soldering to the conductors 106 of the connecting sheet 105. Then the areas 30a are sandwiched between the glass sheets 101. The conductors 30 are bent as described at their region protruding from the panel 100. The diode D is connected between the conductors 30. The conductors 30 are then inserted into the housing 2 from the rear end of the slit 16 and through the through holes 12 into the required position where they are locked by the members 13. The terminal supports 20 may be inserted into the connector 1 before the terminals 30b or afterwards.

Alternatively, the connector 1 may be assembled in advance, and the connecting portions 30a projecting from the slit 16 are inserted and connected to the conductors 106 of the connecting sheet 105, e.g. by soldering, before being sandwiched between the glass sheets 101.

The housing 2, with its sealing end closure 19, is adhesively bonded to the peripheral edge faces of the sheets 101, so that the cavity 15 is sealed to the sheets 101.

As shown in FIG. 4, the arrangement of the bent conductors 30 extending out of the periphery of the panel 100 into the flat connector housing 2 provides a compact shape for the whole construction, as compared with that of FIG. 5. Because the conductor 30 is bent first in the thickness direction of the panel 100 and then in a direction parallel to the periphery of the panel 100, a compact arrangement is achieved, and the external connector 50 is joined to the Connector 1 in a direction parallel to the edge of the panel 100. The two terminals 30b may be coplanar, to make the construction compact. However, within the scope of the invention, the terminals 30b may extend perpendicularly to the edge direction of the panel 100, so that the connection with the external connector 50 is made in this perpendicular direction.

As FIG. 4 shows, the connector 1 may be located between the planes of the exterior main faces of the panel.

As shown in the drawings, the bypass diode D can be easily incorporated into the solar cell panel construction.

The locking of the terminal 30b into position by engagement of the projection 13a with the recess 30c effectively retains the terminal in the correct position, even against the fitting force of the terminal 55 of the external connector 50.

The return force of the springs 25 ensures continued engagement of the hook 60a with the corresponding recess 3a.

While the invention has been illustrated by an exemplary embodiment described above, many equivalent modifications and variations will be apparent to those skilled in the art when given this disclosure. Accordingly, the exemplary embodiment of the invention set forth above is considered to be illustrative and not limiting. Various changes to the described embodiment may be made without departing from the spirit and scope of the invention.

What is claimed is:

1. A solar cell panel comprising:

a pair of superimposed plates having a periphery;

at least one solar energy cell sandwiched between said superimposed plates;

a connector for use in making electrical connection to an external connection member in use of the solar cell panel, mounted on said superimposed plates at said periphery thereof and having a housing; and at least one one-piece electrical conductor member having a first end located between said superimposed plates and electrically connected to said at least one solar energy cell and a second end which protrudes from said periphery and is received and held in said housing of said connector, the second end being an electrical terminal that physically and electrically connects with said external connection member.

2. A solar cell panel according to claim 1, the at least one one-piece electrical conductor member comprising a pair of electrical conductor members, which in use have opposite polarity.

3. A solar cell panel according to claim 2, wherein said electrical conductor members are each bent twice, outside said superimposed plates, first to extend in a first direction which is a thickness direction of said superimposed plates and secondly to extend in a second direction substantially parallel to a portion of said periphery, thereby being a pair of parallel spaced terminals of said connector extending in said second direction.

4. A solar cell panel according to claim 2, further comprising a bypass diode connected between said electrical conductor members and housed in said housing.

5. A solar cell panel according to claim 1, wherein said housing has a locking structure that engages said electrical conductor member and holds said electrical conductor member in a longitudinal position in said housing.

6. A solar cell panel according to claim 1, wherein said electrical conductor member is a planar metal strip.

7. A solar cell panel according to claim 1, wherein said housing of said connector is bonded to said periphery of said panel.

8. A solar cell panel according to claim 1, wherein said housing of said connector has a passage, containing said electrical terminal, to receive in use said external connection member, the connector further comprising a support installed in and slidable along said passage and supporting said terminal in position within said passage.

* * * * *